United States Patent [19]
Richards

[11] Patent Number: 5,631,788
[45] Date of Patent: May 20, 1997

[54] FLEX CIRCUIT FOR HEAD AND DISK ASSEMBLY

[75] Inventor: Charles D. Richards, San Jose, Calif.

[73] Assignee: Quantum Corporation, Milpitas, Calif.

[21] Appl. No.: 870,681

[22] Filed: Apr. 17, 1992

[51] Int. Cl.$^6$ .............................. G11B 5/48; G11B 5/55
[52] U.S. Cl. ............................... 360/104; 360/106
[58] Field of Search ...................... 360/97.01, 97.02, 360/104, 137, 106

[56] References Cited

U.S. PATENT DOCUMENTS

| | | | |
|---|---|---|---|
| 4,669,004 | 5/1987 | Moon et al. | 360/77 |
| 4,933,785 | 6/1990 | Morehouse et al. | 360/78.04 |
| 4,979,062 | 12/1990 | Stefansky | 360/137 |
| 4,985,793 | 1/1991 | Anderson | 360/97.01 |
| 5,005,089 | 4/1991 | Thanos et al. | 360/77.08 |
| 5,025,335 | 6/1991 | Stefansky | 360/137 |
| 5,027,241 | 6/1991 | Hatch et al. | 360/105 |
| 5,095,396 | 3/1992 | Putnam et al. | 360/106 |

*Primary Examiner*—Stuart S. Levy
*Assistant Examiner*—Allen T. Cao
*Attorney, Agent, or Firm*—David B. Harrison

[57] ABSTRACT

A flexible circuit construction is provided for connecting stationary electrical components to electrical components of a moving actuator within a head and disk assembly of a disk drive. The flexible circuit is integrally formed from a plastic film material carrying a plurality of metal film conductive traces and defining a plurality of regions. A connecting region has a plurality of connection pads for connecting to head conductor wires. A hairpin loop portion is provided adjacent the connecting region for reversing direction of the flexible circuit. An elongated arcuate portion leads from the hairpin loop portion to a fixed substrate portion defining plural connections for mounting a read preamplifier/write driver/head selection integrated circuit device. The connecting region defines for at least one edge region thereof a head wire tube engagement portion having a slotted opening for positioning and securing a head wire tube carrying the head wires. The connecting region includes a tab structure for engaging an adjacent portion of the moving actuator, whereby when the tab structure engages the adjacent portion, the head wire tube engagement portion is deflected into a guiding position for guiding the head wire tube toward the connection pads of the connecting region.

7 Claims, 3 Drawing Sheets

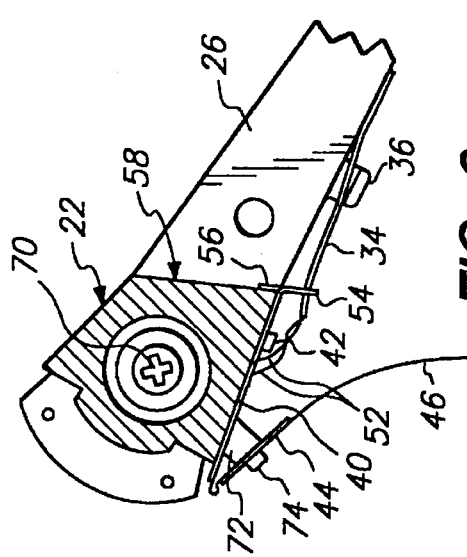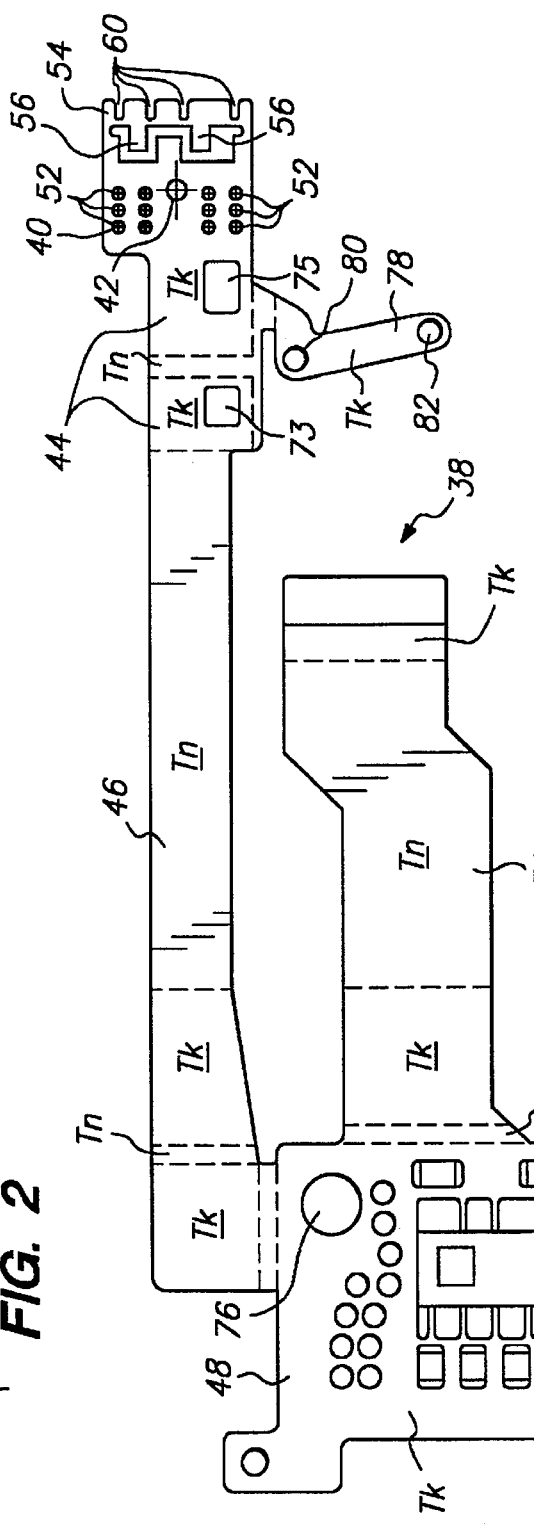

FLEX CIRCUIT FOR HEAD AND DISK ASSEMBLY

FIELD OF THE INVENTION

The present invention relates to disk drives. More particularly, the present invention relates to a flexible circuit construction for connecting stationary electrical components to moving actuator electrical components within a head and disk assembly of a hard disk drive.

BACKGROUND OF THE INVENTION

Hard disk drives essentially include at least one rotating data storage disk defining data storage surfaces. Typically, although not necessarily, each data surface defines a multiplicity of closely spaced apart data tracks. In some disk drives such as those employing optical data storage techniques, a spiral track arrangement is preferred. A read-write data transducer head is positioned by a track accessing mechanism, usually called an actuator, at each desired data storage location by moving the head radially across the storage surface. Usually heads are mounted by a single actuator arm structure, and all heads are radially positioned by a single positioning movement of the actuator. Small voice coil rotary actuators have come into vogue with the proliferation of smaller form factor disk drives, such as those of the 3½ inch, 2½ inch, and smaller storage disk diameters.

Rotary voice coil actuators typically include an "E-block" rotatably mounted by bearings to a post mounted to a base. A flat, multi-turn coil is typically attached to the E-block by a molding or potting compound, and the coil includes two radial side sections which cut through flux lines of opposed polarity present in a magnetic gap through which the coil is displaced as the actuator rotates through its range of limited angular displacement in positioning the head. Permanent magnets fixed to stationary magnet mounting plates typically provide the flux lines in the magnetic gap. When current is passed through the coil in one direction, the coil and E-block rotate in one direction. When current flow direction is reversed, the coil and E-block rotate in the opposite direction. Thus, by applying controlled currents to the coil, the actuator E-block will position the heads at the desired location, and maintain that position in overcoming bias forces otherwise tending to move the transducer off of the desired track location.

Of course, it is necessary to supply the electrical driving current to the actuator coil, and it is also necessary to provide electrical connections to each one of the data transducer heads, so that writing signals may be applied therethrough to the data tracks, and so that minute electrical signals transduced from the data tracks during reading may be conducted to preamplification circuitry.

Typically, connections to the rotary actuator have been made by providing a flexible circuit substrate typically formed of a thin polyimide film carrying conductive circuit traces. One example of a flexible circuit substrate is found in commonly assigned U.S. Pat. No. 4,669,004, as shown in FIGS. 1–3 thereof and identified by a reference numeral 42. A similar substrate, identified by a reference numeral 96, is shown in FIG. 1 of commonly assigned U.S. Pat. No. 5,005,089. A more extended discussion of a flex circuit said to apply zero bias force to the actuator is found in U.S. Pat. No. 4,933,785 beginning at e.g. column 8, lines 18–31, and at column 10, line 7, and continuing through column II, line 32. These prior patents are incorporated herein by way of background reference material, and are believed fairly representative the state of the art known to applicant's assignee.

One drawback of the prior art has been the electrical/mechanical interface between the flex circuit, and very fine conductor wires which extend from the moving end of the flex circuit to each data transducer head. These wires are typically contained in, and guided by a small diameter plastic wire tube which extends from adjacent the flex circuit to adjacent the data transducer head. The wire tube is typically routed along the head arm segment of the E-block and also routed along an edge of a head load beam. Commonly assigned U.S. Pat. No. 5,027,241 illustrates a preferred form of tube and load beam arrangement in FIG. 3 thereof, and this patent is hereby incorporated herein by reference.

Heretofore, it has been a common practice to provide additional mounting structure, or to glue or otherwise affix the plastic guide tubes to the end of the substrate. This arrangement has not always provided for a robust mechanical securement of the guide tubes to the flex circuit, and has required an additional gluing step during drive fabrication. Thus, a hitherto unsolved need has remained for a simplified, yet mechanically robust, mounting arrangement for securing the plastic head wire mounting tubes to the flex circuit.

SUMMARY OF THE INVENTION

A general object of the present invention is to provide a flex circuit for a rotary actuator of a disk drive which overcomes limitations and drawbacks of the prior art.

Another more specific object of the present invention is to provide a single piece flex circuit which includes mechanical features defined therein enabling controlled deformation of a wire tube engaging portion for more effectively securing the wire tube to the flex circuit at the vicinity of the head wire connections with the flex circuit.

A flexible circuit construction in accordance with principles of the present invention is provided for connecting stationary electrical components to electrical components of a moving actuator within a head and disk assembly of a disk drive. The flexible circuit is integrally formed from a plastic film material carrying a plurality of metal film conductive traces and defining a plurality of regions. A connecting region has a plurality of connection pads for connecting to head conductor wires. A hairpin loop portion is provided adjacent the connecting region for reversing direction of the flexible circuit. An elongated arcuate portion leads from the hairpin loop portion to a fixed substrate portion defining plural connections for mounting a read preamplifier/write driver/head selection integrated circuit device. The connecting region defines for at least one edge region thereof a head wire tube engagement portion having a slotted opening for positioning and securing a head wire tube carrying said head wires. The connecting region includes a tab structure for engaging an adjacent portion of said moving actuator, whereby when said tab structure engages said adjacent portion, the head wire tube engagement portion is deflected into a guiding position for guiding the head wire tube toward the connection pads of said connecting region.

In one aspect of the present invention the moving actuator comprises a mass balanced rotary voice coil actuator. In this aspect, the tab structure engages an endwall separating two head arm tines of said head arm.

In a related aspect of the present invention, the head-arm block means comprises an E-block defining three spaced apart, vertically aligned head arm tines, and wherein said tab structure comprise two vertically spaced apart tabs for engaging two aligned endwalls separating two adjacent pairs of the three spaced apart, vertically aligned head arm tines.

As another aspect of the present invention, each head arm tine defines a head wire guiding boss for guiding a said head wire tube toward said head wire tube engagement portion.

As a further aspect of the present invention, the moving actuator defines a grounding boss extending outwardly toward said hairpin loop region, the grounding boss cooperating with a fastener for securing the hairpin loop region and for grounding the moving actuator to a ground connection of said flex circuit, a further ground connection thereof being provided at said fixed substrate portion thereof.

These and other objects, advantages, aspects and features of the present invention will be more fully understood and appreciated upon consideration of the following detailed description of a preferred embodiment, presented in conjunction with the accompanying drawings.

BRIEF DESCRIPTION OF THE DRAWINGS

In the Drawings:

FIG. 2 is a somewhat diagrammatic plan view in horizontal section taken below a top head arm line of a portion of an E-block segment of a rotary actuator within the FIG. 1 head and disk assembly to show engagement with, and deflection of, the FIG. 1 flex circuit by an endwall portion of the E-block segment in accordance with principles and aspects of the present invention.

FIG. 3 is an enlarged planar detail view of an undeformed flex circuit incorporating principles and features of the present invention prior to being deformed and installed on the head and disk assembly as shown in FIG. 1, for example.

DETAILED DESCRIPTION OF A PREFERRED EMBODIMENT

Figure 1:
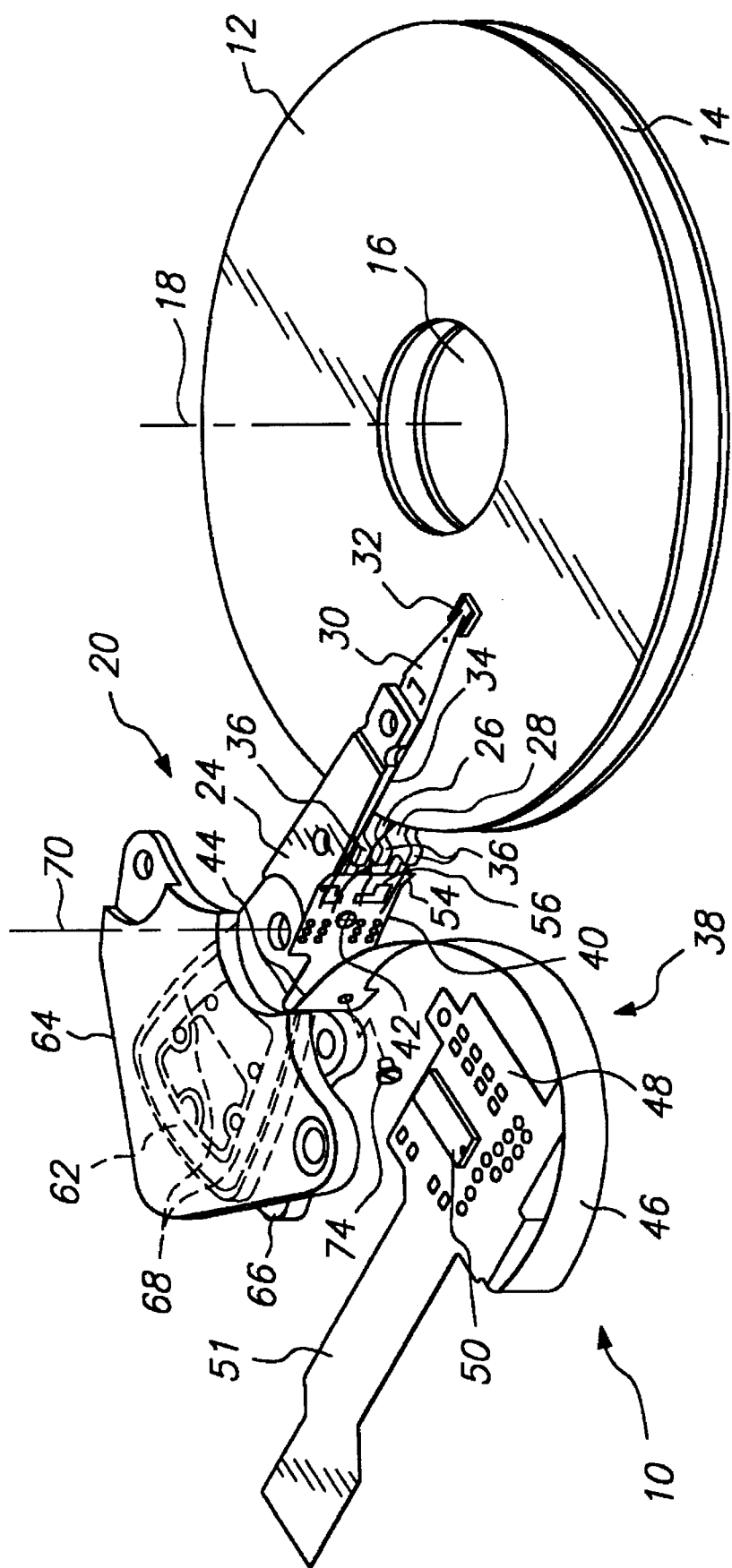
FIG. 1 is an enlarged diagrammatic view in perspective of a hard disk drive head and disk assembly illustrating principles and aspects of the present invention.

A head and disk assembly 10 of a disk drive includes e.g. two data storage disks 12 and 14 which are mounted to a spindle assembly 16 which rotates about an axis of rotation denoted by the dashed line and reference numeral 18. An in-hub DC brushless spindle motor (not shown in FIG. 1) provides the motive force for rotating the disks 12 and 14 at a predetermined desired angular velocity relative to a base 11, shown in FIG. 4.

A rotary voice coil actuator assembly 20 typically includes a single piece E-block 22 defining e.g. three head arm tines 24, 26 and 28. A load beam 30 is swaged onto a distal end of each load arm tine 24, 26, 28, as is conventional. The load beam 30 supports a gimbal mounted head slider 32 which flies upon an air bearing or cushion resulting from airflow generated by rotation of the disk 12, 14, relative to its associated, circumferentially fixed data transducer head 32 (there being at least one head per data surface of each disk).

A plastic wire tube 34 extends along one edge of the load beam 30 and associated head arm tine 24, 26 and 28 and within a slotted guiding boss 36 integrally formed with, and extending from, the head arm tine, as shown in FIG. 1. The guiding bosses 36 of each tine secure and guide the plastic head wire tubes into an appropriate position relative to engagement with a flex circuit 38. Single tubes are guided by the guiding bosses 36 of the tines 24 and 28, while the middle tine 26 guides two wire tubes in an over-under woven arrangement, also as shown in FIG. 1.

The flex circuit 38 is formed of a suitable flexible polyimide film material in accordance with principles of the present invention, so that it includes a connecting region 40 which is secured to the E-block 22 by a screw 42. A hairpin loop portion 44 reverses the direction of the flex circuit 38 and results in a gently arcuate portion 46 leading to a fixed substrate portion 48 containing a head signal preamplifier, write driver, head selector circuit 50.

Head wires 52 are attached to connection pads of the connecting region 40 in a suitable fashion, e.g. by soldering. In accordance with principles of the present invention, a deflected wire tube engagement portion 54 of the flex circuit 38 is provided for mechanically mounting and locating the wire guide tubes 34. The wire tube engagement portion 54 is oriented in its deflected position shown in FIG. 1 by virtue of two tabs 56 which engage endwalls 58 of the E-block 22 defined between adjacent tines 24–26 and 26–28 thereof.

As shown in FIG. 2, the endwalls 58 are generally at a substantial angle with respect to a major plane of the connecting region 40. The wire tube engagement portion 54 and the tabs 56 are dimensioned and spaced such that when the tabs are engaged against the endwalls 58, the engagement portion 54 remains suitably deflected into the desired tube-guiding orientation shown in FIG. 1. As shown in FIG. 1, the engagement portion 54 defines engagement slots 60 which are enlarged at an inner end thereof for permitting the tubes 34 to be slipped into position in the engagement portion 54 and for locking the head wire tubes 34 in place. Thus, the flex circuit 38 integrally provides a tube guiding and mounting arrangement without requiring any additional structure and without requiring any glues or adhesives for locking the head wire tubes in place.

Figure 4:
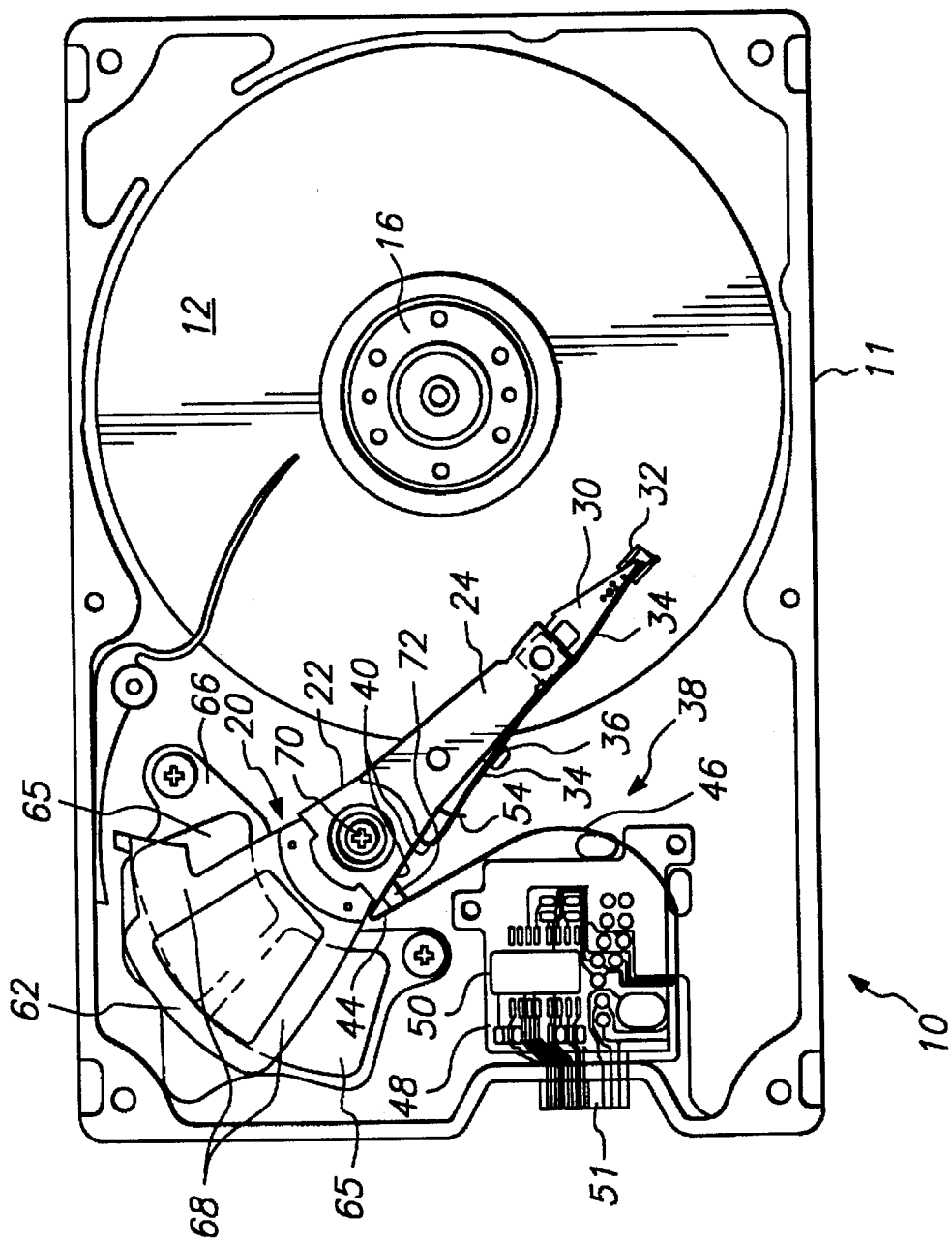
FIG. 4 is a top plan view of the FIG. 1 head and disk assembly.

FIG. 3 illustrates the planar layout of the flex circuit 38 before it is deflected into its intended shape as shown in FIGS. 1 and 4. Also, in FIG. 1, a portion of the flex circuit (denoted by two generally parallel dashed lines) is broken away to show a grounding boss 72 which provides an electrical ground connection of the E-Block to the hairpin turn portion 44 of the flex circuit 38. Two generally rectangular openings 73 and 75 formed in the hairpin region 44 of the flex circuit 38 permit passage of the grounding boss 72 therethrough. A screw 74 enables a positive electrical connection to be made, and also aids and promotes the hairpin turn geometry of the portion 44 as desired. Some portions of the flex circuit 38 are made thicker than other portions, thereby to reinforce the thicker portions. Thicker portions are denoted by a reference symbol Tk in FIG. 3, whereas thinner portions of the flex circuit, such at highly deformed or highly flexible regions, are denoted by the reference symbol Tn in FIG. 3. The thicker portions Tk are typically about 10 mils in thickness, whereas the thinner and more flexible portions Tn are typically 4–5 mils in thickness.

Also worth mentioning is that the actuator 20 includes a flat coil 62 moveably positionable between a gap defined between an upper magnet plate 64 and a lower magnet plate 66 which carry magnets 65 (see FIG. 4) having polar faces generating opposed N-S fields in respective regions of radial legs 68 of the coil 62. The actuator structure 20 rotates about a post about an axis of rotation denoted by a dashed line and a reference numeral 70 and along a locus of limited rotational displacement sufficient to position the heads 32 from a circumferentially outermost region of the disk 12, 14 to an innermost region thereof. A tab extension 78 of the flex circuit 38 includes two solder opening regions 80 and 82 which enable the tab extension 78 to be soldered to two connection posts of the coil 62. The tab extension 78 is bent under the actuator 20 and soldered to the posts which extend from the underside of the coil 62.

The flex circuit 38 carries a plurality of conductive traces including e.g. two power traces for providing a current path to the actuator coil 68. A ground trace extends between the grounding boss 72 and a grounding screw 76 which grounds the fixed substrate portion 48 to the metal base of the head and disk assembly 10. Plural head signal traces connect from the connection pads 52 to corresponding pads of the integrated circuit device 50. A flex circuit connector segment 51 connects the flex circuit and the internal electrical components of the head and disk assembly 10 to an external circuit board in a conventional fashion.

Having thus described an embodiment of the invention, it will now be appreciated that the objects of the invention have been fully achieved, and it will be understood by those skilled in the art that many changes in construction and widely differing embodiments and applications of the invention will suggest themselves without departing from the spirit and scope of the invention. The disclosure and the description herein are purely illustrative and are not intended to be in any sense limiting.

What is claimed is:

1. A flexible circuit construction for connecting stationary electrical components to electrical components of a moving actuator means within a head and disk assembly of a disk drive, integrally formed from a plastic film material carrying a plurality of metal film conductive traces and defining a connecting region having a plurality of connection pads for connecting to head conductor wires, an elongated arcuate portion leading from the connecting region to a fixed substrate portion defining plural connections for mounting a read preamplifier/write driver/head selection integrated circuit device, the connecting region defining at least one edge region thereof a head wire tube engagement portion defining a slotted opening for positioning and securing a head wire tube carrying said head wires, said connecting region including tab means for engaging an adjacent portion of said moving actuator means, whereby when said tab means engages said adjacent portion, the head wire tube engagement portion is deflected into a guiding position for guiding said head wire tube toward said connection pads of said connecting region.

2. The flexible circuit construction set forth in claim 1 further comprising a hairpin loop portion adjacent the connecting region for reversing direction of the flexible circuit and leading to the elongated arcuate portion.

3. The flexible circuit construction set forth in claim 1 wherein said moving actuator means comprises a mass balanced rotary voice coil actuator.

4. The flexible circuit construction set forth in claim 3 wherein said rotary voice coil actuator includes a head-arm block means, and wherein said tab means engages an endwall separating two head arm tines of said head arm means.

5. The flexible circuit construction set forth in claim 4 wherein said head-arm block means comprises an E-block defining three spaced apart, vertically aligned head arm tines, and wherein said tab means comprise two vertically spaced apart tabs for engaging two aligned endwalls separating two adjacent pairs of the three spaced apart, vertically aligned head arm tines.

6. The flexible circuit construction set forth in claim 4 wherein each said head arm tine defines a head wire guiding boss means for guiding a said head wire tube toward said head wire tube engagement portion.

7. The flexible circuit construction set forth in claim 2 wherein said moving actuator means defines a grounding boss extending outwardly toward said hairpin loop region, the grounding boss cooperating with fastening means for securing the hairpin loop region and for grounding the moving actuator means to a ground connection of said flex circuit, a further ground connection thereof being provided at said fixed substrate portion thereof.

* * * * *